United States Patent [19]

Beyers, Jr.

[11] 4,065,681
[45] Dec. 27, 1977

[54] VOLTAGE STORAGE CIRCUIT USEFUL IN TELEVISION RECEIVER CONTROL APPLICATIONS

[75] Inventor: Billy Wesley Beyers, Jr., Greenfield, Ind.

[73] Assignee: RCA Corporation, New York, N.Y.

[21] Appl. No.: 740,628

[22] Filed: Nov. 10, 1976

[51] Int. Cl.² .................. H03K 17/22; H03K 17/60
[52] U.S. Cl. .................................. 307/246; 307/230;
330/86; 328/147; 328/151; 358/168; 358/169;
307/358
[58] Field of Search ............... 307/230, 246, 238, 358;
328/146, 147, 150, 151; 358/21, 27, 168, 169;
330/82, 86

[56] References Cited

U.S. PATENT DOCUMENTS

| 3,654,560 | 4/1972 | Cath et al. | 307/230 X |
|---|---|---|---|
| 3,700,920 | 10/1972 | Eyler | 328/150 X |
| 3,725,682 | 4/1973 | Rubin et al. | 307/246 X |
| 3,767,939 | 10/1973 | Chamran et al. | 307/246 X |
| 3,867,702 | 2/1975 | Torpie et al. | 328/147 X |
| 4,009,402 | 2/1977 | Miller | 307/246 X |

OTHER PUBLICATIONS

Electronics, Feb. 1976, p. 112, "Video Detector Stores Peak for Minutes" by Hayes, 328-151.

*Primary Examiner*—John S. Heyman
*Attorney, Agent, or Firm*—Eugene M. Whitacre; Paul J. Rasmussen; Peter M. Emanuel

[57] ABSTRACT

A circuit for storing a DC voltage which may be used to control the volume, brightness, contrast, tint or color characteristics of a television receiver includes a semiconductor switching circuit for selectively coupling a DC voltage to a voltage storage capacitor through a DC impedance path. The DC impedance path is coupled between the inverting and noninverting inputs of an operational amplifier. The output of the operational amplifier is coupled to a utilization circuit to be controlled. A feedback path is coupled between the operational amplifier's output and inverting input to provide negative feedback so that a voltage balance is maintained between the inverting and noninverting inputs and thereby substantially eliminate leakage current flow to or from the storage capacitor through the DC impedance path.

15 Claims, 1 Drawing Figure

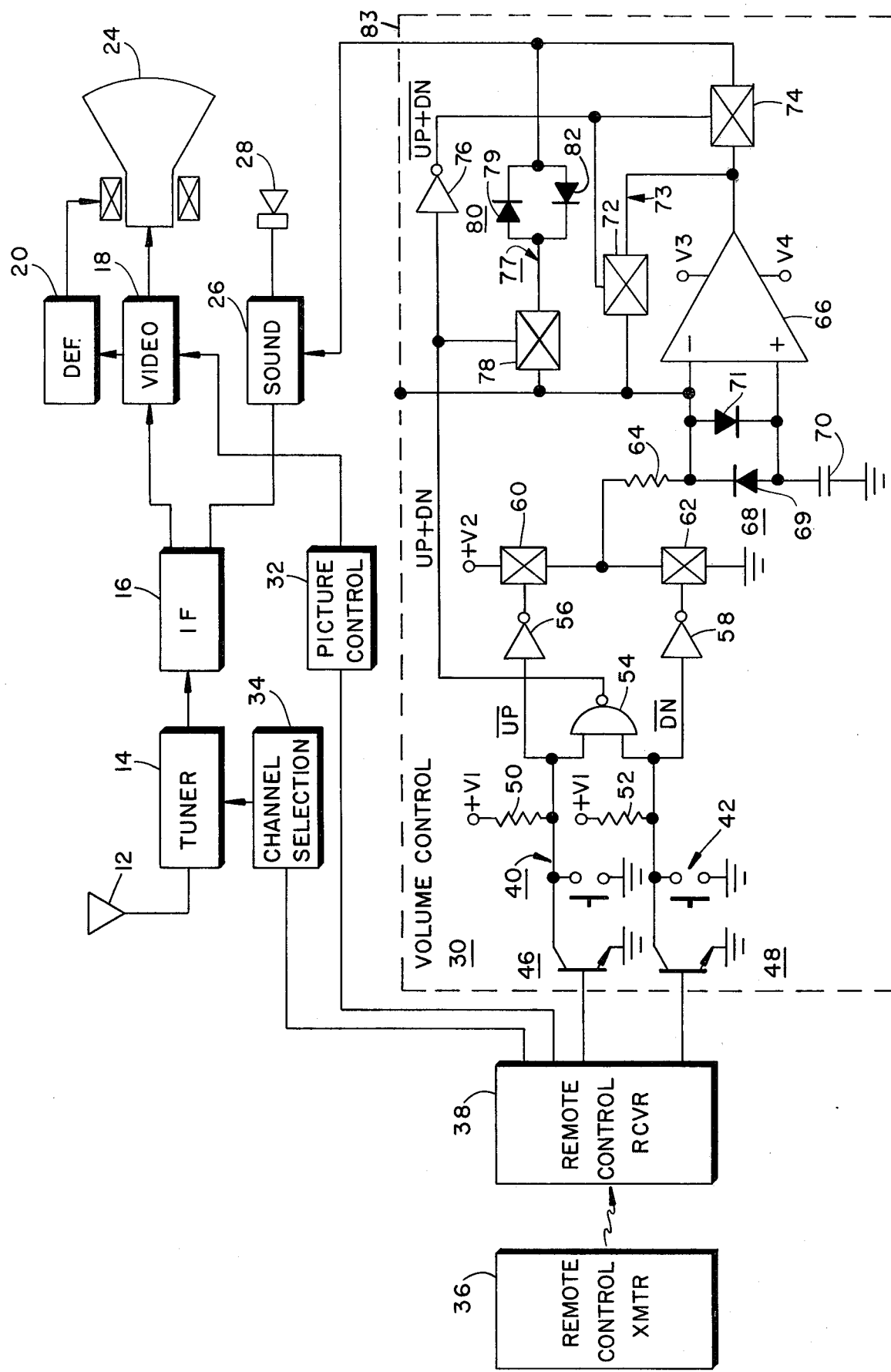

VOLTAGE STORAGE CIRCUIT USEFUL IN TELEVISION RECEIVER CONTROL APPLICATIONS

BACKGROUND OF THE INVENTION

The present invention relates to the field of circuits for generating and storing DC control voltages.

Presently, there are numerous electronic functions which are controlled in response to a DC control voltage. For example, in a television receiver the contrast, brightness, tint, color and volume characteristics may be controlled by the application of a DC control voltage to an appropriate circuit such as a variable gain amplifier. In these applications, the DC control voltage must be maintained or stored for a reasonably long period, e.g., several hours, to accommodate most practical television viewing situations. Circuits for adjusting a particular function at a receiver itself often include a potentiometer coupled between a source of DC voltage and the circuit which is to have its function controlled. Once the potentiometer is adjusted to provide the desired result, the associated DC control voltage is maintained until the next adjustment.

Recently, remote control systems have been developed which permit a user to control an apparatus from a remote location. A remote control system when used in conjunction with a television receiver is particularly desirable since it permits a viewer to optimize viewing and listening conditions with respect to his location. In many prior remote control systems, motor driven potentiometers actuated in response to an encoded remote control signal have been utilized to adjust a DC control voltage. In remote control systems utilizing motor driven potentiometers the DC control voltage is readily maintained once it is adjusted to the appropriate setting. However, because of their mechanical nature, these arrangements tend to be complex, bulky, expensive and susceptible to malfunction.

In order to avoid the disadvantages of motor driven potentiometers, other prior remote control systems have been developed which are essentially electronic (i.e., solid state) in nature. One such remote control system includes a counter and a digital to analog (D/A) converter, such as a resistive matrix, which generates a DC control signal in response to the contents of the counter. The contents of a counter are increased or decreased in response to an encoded remote control signal until the desired characteristic is reached. Thereafter, the contents of the counter are held constant until the next adjustment. Such a remote control system is described in the RCA manual entitled, "XL-100 Color Television — The CTC-74 and CTC-81 Chassis", published by RCA Corporation, Indianapolis, Indiana.

In order to reduce the cost of remote control systems, circuits are desired which more simply and directly generate and maintain a DC control signal than the types of systems described above. For example, a circuit in which a voltage storage capacitor can be selectively charged or discharged to develop a DC control voltage and thereafter effectively isolated to prevent leakage currents from changing the stored voltage may be advantageously employed in a remote control system. Of course, circuits utilizing mechanical or electromechanical (i.e., relay) devices for selectively charging and discharging a capacitor are known. Because of the extremely high "off" (i.e., open) resistance of mechanical or electromechanical devices, leakage currents associated with such devices are almost negligible. However, mechanical and electromechanical devices are inherently less reliable than their semiconductor counterparts. Unfortunately, the leakage currents associated with semiconductor switches, although small, are not so small that semiconductor switches may readily be used in a circuit to develop and thereafter maintain a DC control voltage across a capacitor for a time long enough to accommodate most television viewing situations. In addition, because the voltage storage capacitor is necessarily coupled to the circuit which is to be controlled in response to the DC control signal stored by the capacitor, leakage currents between the controlled circuit and the storage capacitor will tend to change the DC control voltage. Therefore, there is a requirement in the art for a circuit including a storage capacitor for generating and maintaining a DC control voltage.

SUMMARY OF THE INVENTION

In accordance with the present invention, a circuit for generating a DC control voltage and storing it in a capacitive device for a time long enough for most television viewing situations makes advantageous use of the property of operational amplifiers arranged in a negative feedback configuration by which a substantial voltage balance is maintained between its inputs to reduce leakage currents which may flow to or from the capacitive device. The circuit comprises switching means for selectively coupling at least one source of fixed potential to a capacitive storage device through a DC impedance path. The DC impedance path is coupled between the inputs of an operational amplifier. A negative feedback path is coupled between the output of the operational amplifier and one of its inputs.

DETAILED DESCRIPTION OF THE PREFERRED EMBODIMENT OF THE PRESENT INVENTION

Reference is now made to the accompanying drawing, consisting of a sole FIGURE, which shows partially in block diagram form and partially in schematic diagram form a color television receiver employing the preferred embodiment of the present invention. An antenna 12 of the receiver couples radio frequency carrier signals bearing television information to a tuner 14. Tuner 14 combines the radio frequency carriers with corresponding local oscillator signals to derive an intermediate frequency signal having chrominance, luminance, synchronization and sound signal components. The chrominance, luminance and synchronization signal components are coupled to a video processing unit 18 which separates and processes them. The chrominance and luminance signals are combined to form signals representing red, green and blue color information. A kinescope 24 develops modulated electron beams in response to the color signals. The synchronization signal components are coupled to deflection unit 20 which controls the deflection of the electron beams to form rasters on the face of kinescope 24.

The sound signal components are coupled to a sound signal processing unit 26 and thereafter to a speaker 28 to form audio signals corresponding to the image displayed on kinescope 24. A DC control voltage generated by a volume control unit 30 is coupled to a variable gain amplifier (not shown) included in sound processing unit 26 to control the amplitude of the audio signals and thereby the volume characteristic of the receiver. The brightness, contrast, tint and color characteristics are controlled by respective DC control voltages generated by a picture control unit 32. Although more than one picture characteristic is controlled, picture control unit 32 is shown for the sake of simplicity as having only a single input and output. The contrast and color characteristics, like the volume characteristic, are controlled by controlling the gains of respective variable gain amplifiers. The brightness characteristic is controlled by controlling the DC level of the luminance signal component. The tint characteristic is controlled by controlling the phase shift of chrominance signal components.

A viewer may adjust a particular DC control voltage until the corresponding characteristic reaches a desired setting by depressing an appropriate push button on a remote control transmitter 36. In response, remote control transmitter 36 generates an encoded ultrasonic signal. A remote control receiver 38 detects the encoded ultrasonic signal and enables the appropriate control unit to adjust the associated DC control voltage. In addition, a viewer may select a channel by sequentially depressing the push buttons corresponding to the two digits comprising the channel number. In response, remote control transmitter 36 generates an encoded ultrasonic signal which is decoded by remote control receiver 38 to form binary coded signals representing the channel selected. These binary signals are coupled to a channel selection unit 34 which, in response, adjusts the frequency of the local oscillator (not shown) included within tuner 14 to the frequency required to tune the selected channel. A color television receiver and an associated remote control system of the types so far described are disclosed in the aforementioned RCA training manual.

Each of the control units are arranged in a similar fashion. Therefore, only volume control unit 30 will be described in detail.

When the "up" volume push button on remote control transmitter 36 is depressed to increase the volume, a positive voltage level is coupled to the base of an NPN transistor 46. Transistor 46 is arranged in a common-emitter switch configuration having its collector coupled to a source of positive voltage V1 through a resistor 50 and its emitter coupled to ground. Transistor 46 is rendered conductive in response to the application of the positive voltage to its base and, as a result, generates an UP signal, having a "low" logic level (e.g., approximately equal to the potential at ground), at its collector. The UP signal is coupled to one input of nand gate 54 and to a logic level inverter 56. Inverter 56 inverts the Up to form an UP signal, i.e., the logic complement of the UP signal, having a "high" logic level (e.g., approximately equal to the potential of V1), which is coupled to the control input of transmission gate 60. In a similar fashion, when the "down" volume push button is depressed to decrease the volume, a DN signal is coupled to the control input of transmission gate 62 and a DN signal is coupled to the other input of nand gate 54 by virtue of the operation of the NPN transistor 48, pull-up resistor 52 and inverter 58.

Furthermore, manually operable single-pole. single-throw switches such as 40 and 42 may be mounted on the receiver so that a viewer may control the volume at the receiver itself. When switch 40, coupled between the collector of transistor 46 and ground, is depressed (closed), UP and UP signals are generated. When switch 42, coupled between the collector of transistor 48 and ground, is depressed (closed), DN and DN signals are generated.

Transmission gates 60 and 62 have their conduction paths coupled in a cascode configuration between a source of positive voltage V2 and ground. The common junction of transmission gates 60 and 62 is coupled through a resistor 64 and a parallel combination 68 of a pair of oppositely poled diodes 69 and 71 to a voltage storage capacitor 70. Transmission gates 60 and 62, as well as the remainder of the transmission gates to be described, are semiconductor switches which are rendered conductive in response to the application of a logic "high" level to their control inputs and rendered nonconductive in response to the application of a logic "low" level to their control inputs. For example, the transmission gates may comprise a COS/MOS (COmplementary Symmetry — Metal Oxide Semiconductor) arrangement such as is found, for example, in a CD4066 integrated circuit available from RCA Corporation. Typically, in a COS/MOS transmission gate, a P-type MOS/FET (Metal Oxide Semiconductor — Field Effect Transistor) and an N-type MOS/FET are configured in a parallel conduction path arrangement with their drain electrodes connected to an input terminal, their source electrodes connected to an output terminal, the gate electrode of the N-type MOS/FET connected to a control input terminal and the gate electrode of the P-type MOS/FET coupled to the control input terminal through a logic level inverter.

As long as an UP signal exists, capacitor 70 is charged from the source of +V2 through the conducting conduction path of transmission gate 60, resistor 64 and forward-biased diode 71. As long as a DN signal exists, capacitor 70 is discharged to ground through the conducting conduction path of transmission gate 62, resistor 64 and forward-biased diode 71. The durations of the UP and DN signals determine the amplitude of the DC control voltage developed across capacitor 70.

After the termination of the UP and DN signals, transmission gates 60 and 62 are rendered nonconductive. Thereafter, theoretically at least, the voltage across capacitor 70 should be maintained. Unfortunately, semiconductor switches such as transmission gates 60 and 62, unlike their mechanical or electromechanical counterparts, have finite leakage or off resistances in their nonconductive state through which a storage capacitor to which they are coupled may be undesirably charged or discharged to a voltage which is no longer sufficiently representative of the information desired to be stored.

The effect of the finite "off" resistance of a semiconductor switch may be understood by considering a DC control circuit in which a DC control voltage is stored in a capacitor having a capacitance of 1 microfarad coupled to ground through a nonconductive semiconductor switch, such as is included in a CD 4066 integrated circuit, having an off resistance of 100 megohms. The time constant (i.e., the time required for 63 percent of the stored voltage to be discharged) of such an arrangement is 100 seconds. Under these conditions, as viewer would have to readjust his receiver as often as 36 times an hour. Therefore, before a DC control circuit including a semicondutor switch and a storage capacitor can be realistically employed in a receiver, it is desirable that it include provisions to minimize semiconductor leakage currents so that a viewer is not inconvenienced by having to make frequent readjustments.

Of course, the time constant of a DC control circuit including a storage capacitor can be increased by increasing the capacitance of the storage capacitor. However, in order to provide a sufficiently long storage time compatible with most television viewing situations, e.g., situations in which a viewer may watch television for 3 or 4 hours without an adjustment, the capacitance of the storage capacitor would have to be so large that it would require an unduly long time, utilizing currents compatible with semiconductor current operating ranges, to charge or discharge it during adjustment. This is undesirable since a viewer should be provided with almost a spontaneous indication of the effects of the adjustment as he is making it. That is, it would be extremely annoying to a viewer if he had to pause continually to evaluate the effects of the adjustment up to that point before proceeding.

The characteristic of a differential input operational amplifier arranged in a negative feedback configuration whereby the voltage between its two inputs is maintained substantially equal to zero, described in detail with other operational amplifier characteristics in the "Handbook of Operational Amplifier Applications", published by Burr-Brown Research Corporation, Tucson, Arizona in 1963, is advantageously employed in control circuit 30 so that the voltage stored by capacitor 70 after being charged or discharged is maintained substantially constant for a time sufficiently long for most television viewing situations. Accordingly, the diode pair 68 is coupled between the inverting (−) and noninverting (+) inputs of an operational amplifier 66 arranged in a negative feedback configuration by virtue of negative feedback path 73 coupled between its output and its inverting (−) input. Once capacitor 70 is charged, by virtue of the conduction of transmission gate 60 and diode 71, or discharged, by virtue of the conduction of transmission gate 62 and diode 71, substantially no leakage current can flow through either diode 69 or diode 71 because the voltage between the inverting (−) input and noninverting (+) input of operational amplifier 66 is maintained substantially equal to zero due to the negative feedback operation of operational amplifier 66.

In order to establish a DC control voltage across capacitor 70, current must be able to flow either through diode 69 or diode 71. However, while negative feedback path 73 is closed, as noted above, the voltage between the inverting (−) input and the noninverting (+) input of operational amplifier 66 is maintained substantially equal to zero and as a result, substantially no current can flow through either diode 69 or diode 71. Therefore, when transmission gate 60 is rendered conductive to charge capacitor 70 or when transmission gate 62 is rendered conductive to discharge capacitor 70, so that current is able to flow through diode 69 or diode 71, a transmission gate 72 included in negative feedback path 73 is rendered nonconductive in response to a "high" level UP + DN logic signal, signifying that the volume is being either increased or decreased, generated by nand gate 54 in response to either an UP or DN signal. As a result, negative feedback path 73 is opened, thereby enabling a large enough voltage (e.g., greater than 0.5 VDC) to be developed between the inverting (−) and noninverting (+) inputs of operational amplifier 66 to render one of diodes 69 or 71 conductive, depending on whether capacitor 70 is to be charged or discharged.

When the negative feedback path of an operational amplifier is opened, the output voltage of the operational amplifier tends to move abruptly toward the value of one of its supply voltages in response to the application of a signal to one of its inputs. Therefore, so that the output voltage of operational amplifier 66 does not suddenly jump to the value of one of its supply voltages V3 or V4 (e.g., +10 VDC or ground potential), thereby undesirably causing the volume to take a corresponding jump, the output of operational amplifier 66 is disconnected from sound processing unit 26 while the volume is being adjusted, i.e., while feedback path 73 is opened. This is accomplished when a transmission gate 74, coupled between the output of operational amplifier 66 and sound processing unit 26, is rendered nonconductive in response to an $\overline{\text{UP + DN}}$ signal having a "low" logic level. The $\overline{\text{UP + DN}}$ signal is generated in response to the UP + DN signal by a logic level inverter 76.

So that a viewer can immediately be aware of the effects of his adjustment, even though the output of operational amplifier 66 has been disconnected from sound processing unit 26 by virtue of the operation of transmission gate 74, substantially the same DC control voltage which is coupled to capacitor 70 is selectively coupled to sound processing unit 26 through a path 77 when transmission gate 74 is rendered nonconductive to disconnect the output of operational amplifier 66 from sound processing unit 26 while capacitor 70 is being charged or discharged. Path 77 comprises the series connection of a transmission gate 78 and a pair 80 of oppositely poled diodes 79 and 81 connected in parallel. Transmission gate 78 is rendered conductive in response to an UP + DN signal. Diode 79 is rendered conductive when capacitor 70 is being charged. Diode 81 is rendered conductive when capacitor 70 is being discharged. Diode pair 80 are desirably included in path 77 to compensate for the voltage developed across pair 68 when capacitor 70 is being charged or discharged.

After the volume adjustment by which the DC volume control voltage is established across capacitor 70, transmission gates 60, 62 and 78 are rendered nonconductive and transmission gates 72 and 74 are rendered conductive. Thereafter, because of the voltage balance maintained between the anodes and cathodes of diodes 69 and 71, only insignificant leakage currents can flow through path 68 and the DC control voltage across capacitor 70 is maintained substantially constant. In addition to maintaining a voltage substantially equal to zero across path 68 so that leakage currents flowing through it to and from capacitor 70 are insignificantly small, operational amplifier 66 serves to buffer storage capacitor 70 from sound processing unit 26 so that the operating conditions of sound processing unit 26 do not affect the voltage stored in capacitor 70. Since operational amplifier 66 is configured in a unitary gain configuration, the DC control signal coupled to sound processing unit 26 from the output of operational amplifier 66 is substantially equal to the voltage stored in capacitor 70.

Many types of operational amplifiers are suitable for use as operational amplifier 66. However, it is desirable to select an operational amplifier having relatively high DC input impedances at its inverting and noninverting inputs so that the voltage across capacitor 70 is not substantially affected by leakage current through the amplifier's inputs. In a circuit utilizing a CA3130 integrated circuit operational amplifier, available from RCA Corporation, as amplifier 66, a 22 megaohm resistor as resistor 64 and a 1.5 microfarad capacitor as storage capacitor 70, it was found that a DC control voltage could be stored with only a 50 millivolt degradation over a 4 hour period. This is compatible with most television viewing situations.

To isolate various portions of volume control circuit 30 from interference signals due to electromagnetic radiation from other portions of the receiver, it may be enclosed or partially enclosed in a conductive shield 82 which is coupled to a suitable source of fixed potential. Although ground is a source of fixed potential to which shields are typically coupled to isolate circuits within from electromagnetic radiation, in volume control circuit 30 it is desirable to connect shield 82 to the inverting (−) input of operational amplifier 66. Because of the substantial equality of the voltages of the inverting (−) and noninverting (+) inputs of operational amplifier 66, the voltage at shield 83 will be subsequently equal to the voltage at the noninverting (+) input of operational amplifier 66. As a result, the voltage across any leakage resistance path between shield 83 and capacitor 70 will have a value substantially equal to zero and any leakage currents which could flow through such leakage resistance paths to change the charge on capacitor 70 will be insignificantly small. Leakage resistance paths between shield 83 and capacitor 70 may be formed, for example, in a printed circuit arrangement by portions of a dielectric slab material on which the circuit elements of control circuit 30 are mounted which come in contact with shield 83 and the noninverting (+) input of operational amplifier 66. Furthermore, it is desirable to couple shield 82 to the inverting (−) input of operational amplifier 66 rather than to the noninverting (+) input since in the former situation, when transmission gate 72 is conductive, shield 83 is coupled to the output of operational amplifier 66 which typically has a low output impedance. As a result, when transmission gate 72 is conductive, shield 83 is driven from a voltage source having a relatively low source impedance across which only relatively small voltages may be developed to upset the voltage balance between shield 83 and the inputs of operational amplifier 66.

Although diode pair 68 is utilized as a DC impedance path to couple charging current to or discharging current from capacitor 70, in response to an UP or DN signal, respectively, other means of coupling charging or discharging current from capacitor 70 may also be utilized. For example, a transmission gate, having its output electrode coupled to the output of nand gate 54 and its input and output terminals coupled to the inverting (−) and noninverting (+) terminals, respectively, of operational amplifier 66 may be utilized. However, the use of a pair of oppositely poled diodes such as 68 has certain desirable features over alternatives. Even though it has been stated that the voltage developed between inverting (−) and noninverting (+) inputs of operational amplifier 66 is substantially equal to zero, in practicality some finite offset voltage, e.g., ±5 millivolts DC, is developed between the inputs. Therefore, when a device having a fixed "off" resistance is coupled between the inverting (−) and noninverting (+) inputs, a finite amount of leakage current determined by the offset voltage may flow to or from capacitor 70. On the other hand, the conduction of a diode is directly related to the voltage applied between its anode and cathode. For example, typical silicon diodes will only become conductive to any significant degree when at least +0.4 VDC is applied between its anode and cathode. Therefore, by using a pair of oppositely poled diodes such as 68, the voltage difference between the inverting (−) and noninverting (+) inputs of operational amplifier 66 must be substantially greater than the normal voltage which is allowed to be developed between the inverting (−) and noninverting (+) inputs when negative feedback path 73 is connected before any significant amount of leakage current can flow. Thus, a conduction stop band is provided by diode pair 68.

Furthermore, when capacitor 70 is being charged or discharged, diode pair 68 prevents excessively high and possibly damaging voltage transients from being developed between the inverting (−) and noninverting (+) inputs of operational amplifier 66. In the event of the application of an excessively high voltage transient, of either positive of negative polarity, to the inverting (−) input of operational amplifier 66, either diode 69 or diode 71, depending on the polarity of the transient, will be rendered conductive preventing the voltage transient from being coupled across the inverting (−) and noninverting (+) inputs.

Although operational amplifier 66 is arranged in a unitary gain configuration, other operational amplifier gain configurations with negative feedback may also be utilized to maintain the voltage balance across path 68. Furthermore, if desired, a resistance element may be inserted in negative feedback path 73, although this may be undesirable when it is desired to drive a shield such as 82 in the manner set forth above.

What is claimed is:

1. Apparatus for controlling a utilization means, comprising:
   a source of fixed potential;
   a circuit point;
   means for selectively coupling said source of fixed potential to said circuit point;
   capacitive means for storing a DC control voltage;
   DC impedance means for coupling said circuit point to said capacitive means to thereby develop said DC control voltage;
   operational amplifier means having first and second input terminals and an output terminal, said DC impedance means being coupled between said first and second input terminals;
   negative feedback means for coupling said output terminal to said first input terminal, the voltages developed at said first and second input terminals being maintained substantially equal when said negative feedback means couples said output terminal to said one of said first input terminals, and
   first switching means included within said negative feedback means for selectively decoupling said output terminal from said first input terminal when said source of fixed potential is coupled to said circuit point.

2. The apparatus recited in claim 1 wherein said DC impedance means comprises a pair of oppositely poled unidirectional conduction devices coupled in parallel configuration.

3. The apparatus recited in claim 2 wherein said unidirectional conduction devices each comprise a diode.

4. The apparatus recited in claim 1 wherein said output terminal is coupled to said utilization means through second switching means, said second switching means selectively decoupling said output terminal from said utilization means when said source of fixed potential is coupled to said circuit point.

5. The apparatus recited in claim 4 wherein third switching means are coupled between one of said first and second input terminals and said utilization means, said third switching means selectively coupling said one input terminal to said utilization means when said source of fixed potential is coupled to said circuit point.

6. The apparatus recited in claim 5 wherein said first input terminal is coupled to said circuit point and said second input terminal is coupled to said capacitive means; said third switching means is coupled between said first input terminal and said output terminal; and said third switching means includes means for developing a voltage drop substantially equal to the voltage drop developed across said DC impedance means when said source of fixed potential is coupled to said circuit point.

7. The apparatus recited in claim 6 wherein said DC impedance means comprises a first pair of oppositely poled unidirectional conduction devices coupled in parallel configuration and said third switching means includes a second pair of oppositely poled unidirectional conduction devices coupled in parallel configuration.

8. The apparatus recited in claim 5 wherein said operational amplifier means and said negative feedback means are arranged in a unitary gain configuration.

9. The apparatus recited in claim 8 wherein said first input terminal is an inverting input terminal and said second terminal a noninverting input terminal.

10. The apparatus recited in claim 9 wherein said negative feedback means has a relatively small impedance when said output terminal is coupled to said inverting input terminal.

11. The apparatus recited in claim 10 wherein said inverting input terminal is coupled to an electromagnetic radiation shield.

12. The apparatus recited in claim 5 wherein said means for selectively coupling said source of fixed potential to said circuit point comprises fourth and fifth switching means coupled in cascode between first and second sources of fixed potential, the common junction of said fourth and fifth switching means being coupled to said first input terminal; said fourth and fifth switching means being alternatively selectively operable to increase and decrease said DC control voltage.

13. The apparatus recited in claim 12 wherein said first, second, third, fourth and fifth switches are semiconductor switches.

14. The apparatus recited in claim 13 wherein said semiconductor switches are transmission gates operable in response to logic level signals.

15. The apparatus recited in claim 5 wherein one of said first and second input terminals are coupled to an electromagnetic radiation shield.

* * * * *

UNITED STATES PATENT OFFICE
CERTIFICATE OF CORRECTION

PATENT NO. : 4,065,681

DATED : December 27, 1977

INVENTOR(S) : Billy Wesley Beyers, Jr.

It is certified that error appears in the above-identified patent and that said Letters Patent are hereby corrected as shown below:

Column 3, line 47, that portion reading "UP" should read -- $\overline{UP}$ --; line 50, that portion reading "UP" should read -- $\overline{UP}$ --; line 52, that portion reading "Up" should read -- $\overline{UP}$ --; line 53, that portion reading "UP" should read -- $\overline{UP}$ --; line 58, that portion reading "DN" should read -- $\overline{DN}$ --; line 67, (first occurrence), that portion reading "UP" should read -- $\overline{UP}$ --; Column 4, line 1, (first occurrence) that portion reading "DN" should read -- $\overline{DN}$ --; Column 5, lines 61 and 62, that portion reading "UP or DN" should read -- $\overline{UP}$ or $\overline{DN}$ --.

Signed and Sealed this

Twenty-third Day of May 1978

[SEAL]

Attest:

RUTH C. MASON
Attesting Officer

LUTRELLE F. PARKER
Acting Commissioner of Patents and Trademarks